United States Patent
Joh

(10) Patent No.: US 9,165,899 B2
(45) Date of Patent: Oct. 20, 2015

(54) STACKED PACKAGE AND METHOD FOR MANUFACTURING THE SAME

(71) Applicant: SK hynix Inc., Icheon-si Gyeonggi-do (KR)

(72) Inventor: Cheol Ho Joh, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/083,687

(22) Filed: Nov. 19, 2013

(65) Prior Publication Data

US 2015/0008580 A1 Jan. 8, 2015

(30) Foreign Application Priority Data

Jul. 2, 2013 (KR) .................. 10-2013-0076876

(51) Int. Cl.
| | |
|---|---|
| H01L 23/488 | (2006.01) |
| H01L 23/00 | (2006.01) |
| H01L 25/065 | (2006.01) |
| H01L 25/00 | (2006.01) |
| H01L 23/498 | (2006.01) |
| H01L 23/538 | (2006.01) |
| H01L 25/10 | (2006.01) |
| H01L 23/31 | (2006.01) |
| H01L 21/56 | (2006.01) |

(52) U.S. Cl.
CPC .......... *H01L 24/14* (2013.01); *H01L 23/49811* (2013.01); *H01L 23/5389* (2013.01); *H01L 24/97* (2013.01); *H01L 25/0657* (2013.01); *H01L 25/105* (2013.01); *H01L 25/50* (2013.01); *H01L 21/561* (2013.01); *H01L 23/3128* (2013.01); *H01L 2224/16225* (2013.01); *H01L 2224/32225* (2013.01); *H01L 2224/48091* (2013.01); *H01L 2224/48227* (2013.01); *H01L 2224/73265* (2013.01); *H01L 2224/97* (2013.01); *H01L 2225/1023* (2013.01); *H01L 2225/1058* (2013.01); *H01L 2924/15311* (2013.01); *H01L 2924/15331* (2013.01)

(58) Field of Classification Search
CPC ..... H01L 24/14; H01L 24/11; H01L 25/0657; H01L 25/50
USPC .................. 257/737, 738, 779, 780
See application file for complete search history.

(56) References Cited

U.S. PATENT DOCUMENTS

| | | | |
|---|---|---|---|
| 5,488,200 A * | 1/1996 | Tsukada ................. | 174/261 |
| 5,765,744 A * | 6/1998 | Tatumi et al. ........... | 228/254 |
| 6,350,668 B1 * | 2/2002 | Chakravorty ............ | 438/612 |
| 6,425,516 B1 * | 7/2002 | Iwatsu et al. ........... | 228/180.22 |
| 6,471,115 B1 * | 10/2002 | Ijuin et al. ............. | 228/180.22 |
| 6,660,944 B1 * | 12/2003 | Inaishi et al. ........... | 174/261 |
| 6,717,245 B1 * | 4/2004 | Kinsman et al. ......... | 257/678 |

(Continued)

*Primary Examiner* — Michele Fan
(74) *Attorney, Agent, or Firm* — William Park & Associates Ltd.

(57) ABSTRACT

The disclosure relates to a stacked package and a method for manufacturing the same. The stacked package includes: a lower package including a substrate formed with ball lands in a periphery of an upper surface thereof, a semiconductor chip mounted over the upper surface, first solder balls formed over the ball lands and each having a side surface cut along an edge of the substrate and a polished upper surface, and a mold part for molding the upper surface including the semiconductor chip and the first solder balls, the cutted side surfaces and polished upper surfaces being exposed by the mold part; and an upper package stacked over the lower package and provided with second solder balls bonded to the first solder balls.

15 Claims, 11 Drawing Sheets

(56) References Cited

U.S. PATENT DOCUMENTS

| | | | |
|---|---|---|---|
| 6,995,041 B2* | 2/2006 | Connell et al. | 438/112 |
| 7,262,080 B2 | 8/2007 | Go et al. | |
| 7,273,768 B2* | 9/2007 | Hwan | 438/113 |
| 7,419,851 B2* | 9/2008 | Lin et al. | 438/107 |
| 8,513,113 B2* | 8/2013 | Oliver et al. | 438/637 |
| 2001/0053657 A1* | 12/2001 | Hembree | 451/28 |
| 2002/0047199 A1* | 4/2002 | Ohuchi et al. | 257/737 |
| 2002/0151164 A1* | 10/2002 | Jiang et al. | 438/613 |
| 2003/0155652 A1* | 8/2003 | Murata et al. | 257/738 |
| 2004/0087046 A1* | 5/2004 | Datta et al. | 438/14 |
| 2005/0106779 A1* | 5/2005 | Bolken et al. | 438/106 |
| 2005/0167798 A1* | 8/2005 | Doan | 257/678 |
| 2005/0227474 A1* | 10/2005 | Mizukoshi et al. | 438/612 |
| 2005/0269700 A1* | 12/2005 | Farnworth et al. | 257/737 |
| 2007/0262452 A1* | 11/2007 | Oi | 257/758 |
| 2008/0006921 A1* | 1/2008 | Park et al. | 257/686 |
| 2009/0079069 A1* | 3/2009 | Jang et al. | 257/737 |
| 2009/0181497 A1* | 7/2009 | Mizukoshi et al. | 438/108 |
| 2010/0213618 A1 | 8/2010 | Pagaila et al. | |
| 2011/0169166 A1* | 7/2011 | Meguro | 257/762 |
| 2011/0193205 A1* | 8/2011 | Hsieh | 257/666 |
| 2011/0272820 A1 | 11/2011 | Lee et al. | |
| 2012/0104580 A1* | 5/2012 | Feng et al. | 257/673 |
| 2013/0059417 A1* | 3/2013 | Kikuchi et al. | 438/109 |
| 2013/0105991 A1* | 5/2013 | Gan et al. | 257/777 |
| 2013/0127041 A1* | 5/2013 | Goh | 257/737 |
| 2013/0130443 A1* | 5/2013 | Lu et al. | 438/113 |
| 2013/0210195 A1* | 8/2013 | Xue et al. | 438/112 |
| 2014/0048906 A1* | 2/2014 | Shim et al. | 257/531 |
| 2014/0264842 A1* | 9/2014 | Lin et al. | 257/737 |

* cited by examiner

STACKED PACKAGE AND METHOD FOR MANUFACTURING THE SAME

CROSS-REFERENCES TO RELATED APPLICATIONS

The present application claims priority under U.S.C. 119(a) to Korean patent application number 10-2013-0076876 filed on Jul. 2, 2013, in the Korean Intellectual Property Office, which is incorporated herein by reference in its entirety.

BACKGROUND

1. Technical Field

The disclosure relates to a semiconductor technology, and more particularly, to a stacked package and a method for manufacturing the same.

2. Description of the Related Art

In the semiconductor industry, packaging technologies for integrated circuits have been continuously been developed to satisfy the demands toward miniaturization and mounting reliability. In recent years, as miniaturization and high performance are demanded in electric and electronic products, various stacking techniques have been developed.

The term "stack" as used in the semiconductor industry means to pile vertically two or more semiconductor chips or semiconductor packages. With these stacking technologies, a memory element may have a memory capacity two or more times greater than that obtainable through semiconductor integration process. Besides the increased memory capacity, the stacked packages also have advantages in terms of mounting density and efficient utilization of a mounting area. For these reasons, research and development for stacked packages have been accelerated.

Among these stacked packages, a Package-On-Package (POP) type stacked package is manufactured by stacking two completely assembled semiconductor packages. Therefore, the POP type stacked package has an advantage in that only the packages sorted as good products through the final electrical test can be selected and assembled.

SUMMARY

Various embodiments are generally directed to a stacked package with a reduced size and an improved heat dissipating property and capable of maximizing the size of a chip mountable in a given package size.

In an embodiment of the invention, a stacked package includes: a lower package including a substrate formed with ball lands in a periphery of an upper surface thereof, a semiconductor chip mounted over the upper surface first solder balls formed over the respective ball lands and each having a side surface cut along an edge of the substrate and a polished upper surface, and a mold part for molding the upper surface including the semiconductor chip and the first solder balls, the cutted side surface and polished upper surface of the first solder balls being exposed by the mold part; and an upper package stacked over the lower package and provided with second solder balls bonded to the first solder balls.

In an embodiment of the invention, a method for manufacturing a stacked package includes: forming ball lands over an upper surface of a strip level substrate having a plurality of unit level substrates and sawing lines, the ball lands being formed over an edge of the respective unit level substrate and the sawing line adjacent thereto; forming first solder balls over the respective ball lands; mounting semiconductor chips over respective upper surfaces of the unit level substrates; forming a mold part for molding the strip level substrate including the semiconductor chips and the first solder balls; polishing the mold part and the first solder balls; manufacturing lower packages by cutting the strip level substrate, the first solder balls and the mold part along the sawing lines; and stacking an upper package over the lower package such that second solder balls of the upper package are bonded to the first solder balls.

In an embodiment of the invention, an electronic system includes a controller, an interface, an input/output unit, and a memory coupled with one another through a bus, the memory including a stacked package comprising: a lower package including a substrate formed with ball lands in a periphery of an upper surface thereof, a semiconductor chip mounted over the upper surface, first solder balls formed over the respective ball lands and each having a side surface cut along an edge of the substrate and a polished upper surface, and a mold part for molding the upper surface including the semiconductor chip and the first solder balls, the cutted side surfaces and polished upper surfaces of the first solder balls being exposed by the mold part; and an upper package stacked over the lower package and provided with second solder balls bonded to the first solder balls.

A memory card including a memory having a stacked package and a controller for controlling the memory, the stacked package comprising: a lower package including a substrate formed with ball lands in a periphery of an upper surface thereof, a semiconductor chip mounted over the upper surface, first solder balls formed over the respective ball lands and each having a side surface cut along an edge of the substrate and a polished upper surface, and a mold part for molding the upper surface including the semiconductor chip and the first solder balls, the cutted side surfaces and polished upper surfaces of the first solder balls being exposed by the mold part; and an upper package stacked over the lower package and provided with second solder balls bonded to the first solder balls.

With the invention, the size of the lower package can be reduced since the solder balls are cut and polished and thus the size of the solder balls of the lower package is reduced. Furthermore, the maximum size of a chip mountable in the lower package since the solder balls are disposed in the periphery of the lower package and the space in the lower package occupied by the solder balls is small. Furthermore, bonding reliability between the upper and lower packages is improved since the upper package is bonded over the large areal upper surface (or side surface) formed by polishing (or cutting) the spherical solder ball having a large diameter. In addition, heat dissipating property can be improved since heat can be rapidly discharged through the solder balls of the lower package exposed to the outside.

DETAILED DESCRIPTION

Hereafter, various embodiments of the invention will be described in detail with reference to the accompanying drawings.

Figure 1:
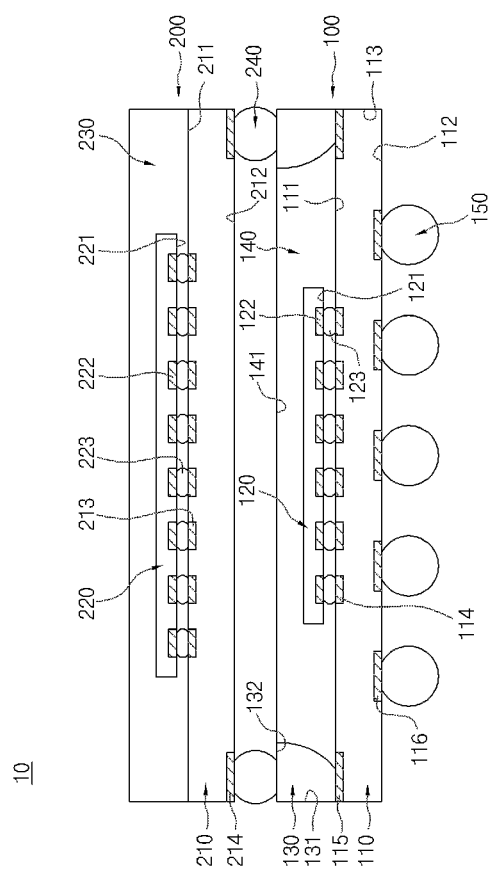
FIG. 1 is a cross-sectional view illustrating a stacked package in accordance with an embodiment of the invention.

Referring to FIG. 1, a stacked package 10 in accordance with an embodiment of the invention may include a lower package 100 and an upper package 200 stacked over the lower package 100.

The lower package 100 may include a first substrate 110, a first semiconductor chip 120, first solder balls 130 and first mold part 140.

The first substrate 110 may have a shape of a rectangular plate. The rectangular plate shaped first substrate 110 may have an upper surface 111, a lower surface 112 and four side surfaces 113 that connect the upper surface 111 and the lower surface 112.

The first substrate 110 may be provided with first bonding fingers 114 and first ball lands 115 on the first surface 111 and may be provided with second ball lands 116 on the lower surface 112. The first bonding fingers 114 may be disposed in the center portion of the upper surface 111 and, the first ball lands 115 may be disposed in the peripheral portion of the upper surface 111 and exposed on the side surface 113.

Though not shown, the first substrate 110 may include in the inside thereof wirings composed of a plurality of layers and conductive vias for electrically coupling the wirings disposed on different layers. The first bonding fingers 114 and the first ball lands 115 formed over the upper surface of the first substrate 110 may be electrically coupled with the second ball lands 116 formed over the lower surface 112 through the wirings and conductive vias formed in the inside of the first substrate 110.

The first semiconductor chip 120 may include a plurality of bonding pads 122 formed over a first surface 121 of the first semiconductor chip 120 facing the first substrate 110 thereof and first bumps 123 formed over the respective first bonding pads 122. The first semiconductor chip 120 may be flip-chip bonded onto the upper surface 111 of the first substrate 110 such that the first bumps 123 may be bonded onto the first bonding fingers 114 of the first substrate 110.

The first solder balls 130 may be formed over the respective first ball lands 115. Each of the first solder balls 130 may be cut along the edge of the first substrate 110 and polished on its upper portion, thereby having a cutted side surface 131 and polished upper surface 132. For example, each of the first solder balls 130 may have a quarter-spherical shape. The cutted side surfaces 131 of the first solder balls 130 may be disposed on the same plane as the side surface 113 of the first substrate 110.

The first mold part 140 may be formed such that it molds the upper surface 111 of the first substrate 110 including the first semiconductor chip 120 and the first solder balls 130 and exposes the cutted side surface 131 and polished upper surface 132 of the first solder balls 130. The upper surface 141 of the first mold part 140 may be disposed on the same plane as the polished upper surfaces 132 of the first solder balls 130. The mold part 140 may include an Epoxy Mold Compound (EMC).

The upper package 200 may include a second substrate 210, a second semiconductor chip 220, a second mold part 230 and second solder balls 240.

The second substrate 210 may be provided with second bonding fingers 213 on an upper surface 211 thereof and may be provided with third ball lands 214 on a lower surface 212 thereof, which correspond to the first solder balls 130 of the lower package 100. The second semiconductor chip 220 may be provided with a plurality of second bonding pads 222 formed over a first surface 221 thereof and second bumps 223 formed over the respective second bonding pads 222. The second semiconductor chip 220 may be flip-chip bonded onto the upper surface 211 of the second substrate 210 such that the second bumps 223 may be bonded to the second bonding fingers 213 of the second substrate 210.

The second mold part 230 may mold the upper surface 211 of the second substrate 210 including the second semiconductor chip 220. The second mold part 230 may include an EMC. The second solder balls 240 may be formed over the respective third ball lands 214 of the second substrate 210. The second solder balls 240 may have a melting point lower than that of the first solder balls 130.

The upper package 200 may be stacked over the lower package 100 such that the second solder balls 240 are bonded to the polished upper surface 132 of the respective first solder balls 130. The third solder balls 150 may be formed over the respective second ball lands 116 of the lower package 100. The stacked package 10 may be mounted over an external device (not shown), e.g. a package substrate by medium of the third solder balls 150.

The invention is not limited to the above embodiment described with reference to FIG. 1 and may be modified to various forms. These modified embodiments would be apparent from the following description with reference to FIGS. 2 to 4. Further, the various embodiments shown in FIGS. 2 to 4 may contain the some of the same features as in FIG. 1, and common reference numerals already shown in FIG. 1 may also be illustrated in FIGS. 2 to 4.

Figure 2:
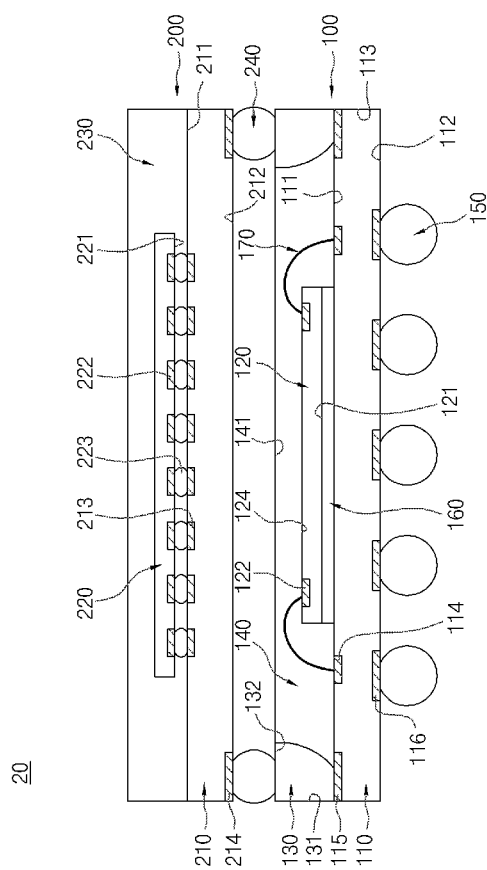
FIG. 2 is a cross-sectional view illustrating a stacked package in accordance with an embodiment of the invention.

Referring to FIG. 2, a stack package 20 in accordance with an embodiment of the invention has a structure in that the first semiconductor chip 120 of the lower package 100 may be mounted over the first substrate 110 in a wire bonding type, unlike the stacked package 10 described with reference to FIG. 1 having a structure in that the first semiconductor chip 120 of the lower package 100 is mounted over the first substrate 110 in a flip-chip bonding type.

Specifically, the first semiconductor chip 120 may have a first surface 121 facing the first substrate 110 and a second surface 124 opposing to the first surface 121. The first surface 121 of the first semiconductor chip 120 may be attached onto the upper surface 111 of the first substrate 110 by medium of an adhesive member 160, and the second surface 124 of the first semiconductor chip 120 may be formed with a plurality of first bonding pads 122. The lower package 100 may include wires 170 for electrically coupling the first bonding pads 122 of the semiconductor chip 120 and the first bonding finger 114 of the first substrate 110. Namely, the first bonding pads 122 of the first semiconductor chip 120 and the first bonding finger 114 of the first substrate 110 may be electrically coupled with each other by medium of the wires 170.

Figure 3:
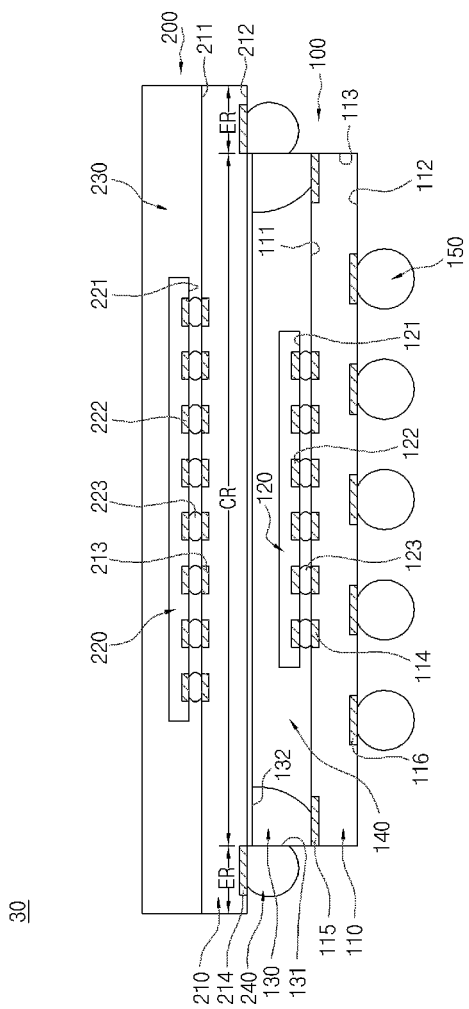
FIG. 3 is a cross-sectional view illustrating a stacked package in accordance with an embodiment of the invention.

Referring to FIG. 3, a stack package 30 in accordance with an embodiment of the invention has a structure in that the second solder balls 240 of the upper package 200 may be bonded onto the cutted side surface 131 of the first solder balls 130 of the lower package 100; unlike the stacked package 10 described with reference to FIG. 1 having a structure in that the second solder balls 240 of the upper package 200 may be bonded onto the polished upper surface 132 of the first solder balls 130 of the lower package 100.

Specifically, the second substrate 210 of the upper package 200 may have an area larger than that of the lower package 100. The lower surface 212 of the second substrate 210 may be divided into a center region CR that faces the lower package 100 and an edge region ER disposed outside of the center region CR, and the third ball lands 214 may be formed in the edge region ER along the perimeter of the center region CR.

The second solder balls 240 may be formed over the respective third ball lands 214. The upper package 200 may be stacked over the lower package 100 such that the second solder balls 240 are bonded onto the cutted side surface 131 of the first solder balls 130, respectively.

With an embodiment of FIG. 3, a thinner stacked package may be provided since the second solder balls 240 may be bonded to the first solder balls 130 on a side surface of the lower package 100 and thus a gap between the upper package 200 and the lower package 100 may be decreased to zero or substantially zero.

Figure 4:
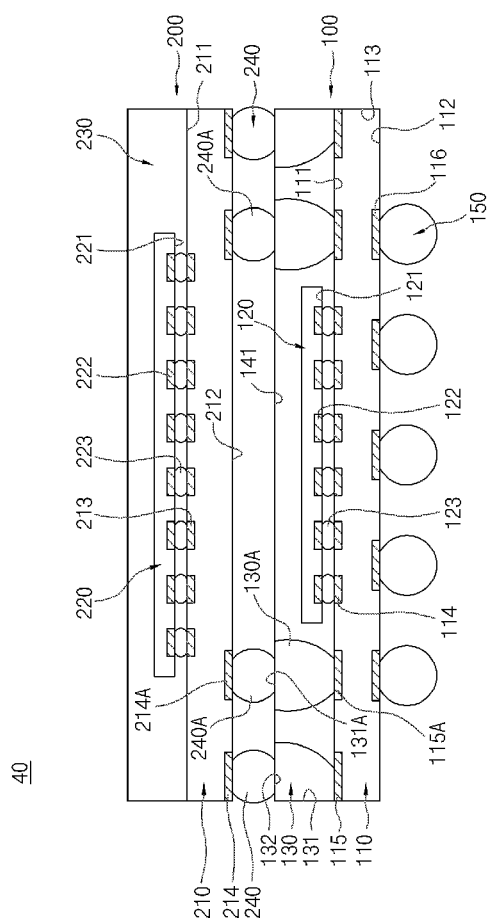
FIG. 4 is a cross-sectional view illustrating a stacked package in accordance with an embodiment of the invention.

Referring to FIG. 4, a stacked package 40 in accordance with an embodiment of the invention has a structure that may further include additional first ball lands 115A, additional first solder balls 130A, additional third ball lands 214A and additional second solder balls 240A, in addition to the constitutions of the stacked package 10 described with reference to FIG. 1.

Specifically, the first substrate 110 of the lower package 100 may further include additional first ball lands 115A on the upper surface 111, and the lower package 100 may further include additional first solder balls 130A formed over the respective additional first ball lands 115A. Upper portions of the additional first solder balls 130A may be polished and thus each of the additional first solder balls 130A may have a flat upper surface 131A. The upper surfaces 131A of the additional first solder balls 130A may be disposed on the same plane as the polished upper surface 132 of the first solder balls 130 and the upper surface 141 of the mold part 140.

In addition, the second substrate 210 of the upper package 200 may further include on the lower surface 212 thereof the additional third ball lands 214A which correspond to the additional first solder balls 130A; and the upper semiconductor package 200 may further include additional second solder balls 240A which are formed over the respective additional third ball lands 214A and bonded to the upper surface 131A of the additional first solder balls 130A, respectively.

Hereafter, the process steps of manufacturing a stacked package will be described with reference to FIGS. 5 to 13.

Figure 5:
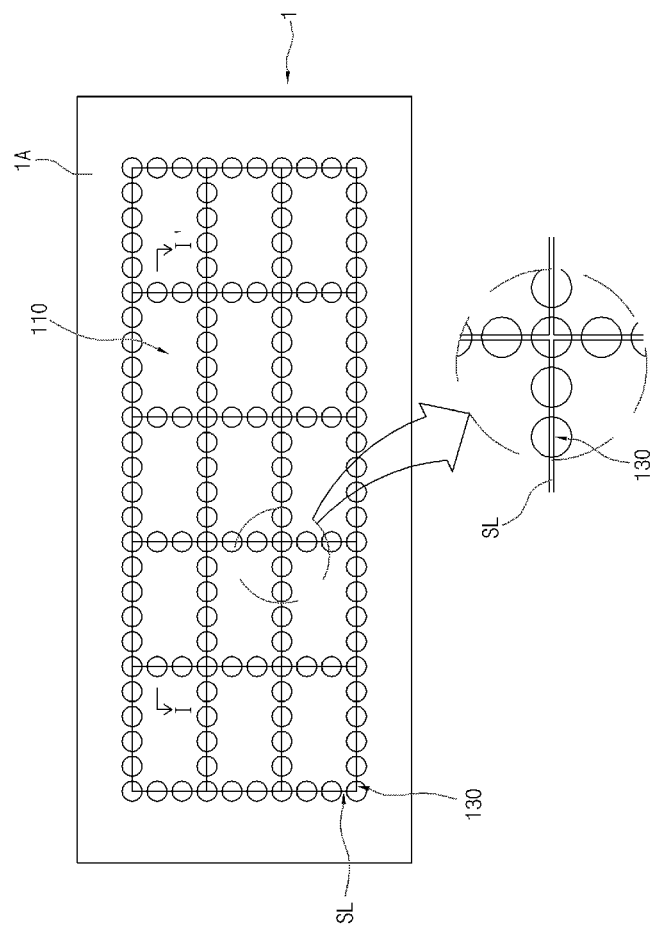
FIGS. 5 to 13 are views illustrating the process steps of manufacturing a stacked package in accordance with an embodiment of the invention.
Figure 6:
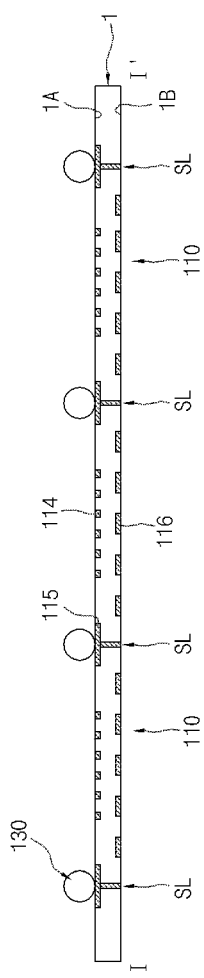

Referring to FIGS. 5 and 6, first ball lands 115 may be formed over an upper surface 1A of a strip level substrate 1 having a plurality of unit level substrates 110 and sawing lines SL for dividing the unit level substrates 110. Here, FIG. 5 is a plan view illustrating the strip level substrate 1, and FIG. 6 is a cross-sectional view taken along a line I-I' of FIG. 5.

Each of the unit level substrate 110 may be provided with the first bonding fingers 114 on the upper surface 1A thereof, and may be provided with the second ball lands 116 on a lower surface 1B opposing to the upper surface 1A.

Each of the first ball lands 115 may be formed over the edge of the unit level substrate 110 and the sawing line SL adjacent to the edge of the unit level substrate 110. In an embodiment, each of the first ball lands 115 may be formed continuously over the edges of the adjoining unit level substrates 110 and the sawing line SL between the unit level substrates 110. That is to say, each of the first ball lands 115 may be shared by the adjoining unit level substrates 110.

Subsequently, first solder balls 130 may be formed over the respective first ball lands 115. Like the first ball lands 115, each of the first solder balls 130 may be formed over the edges of the adjoining unit level substrates 110 and the sawing line SL between the unit level substrates 110, and may be shared by the adjoining unit level substrates 110.

Figure 7:
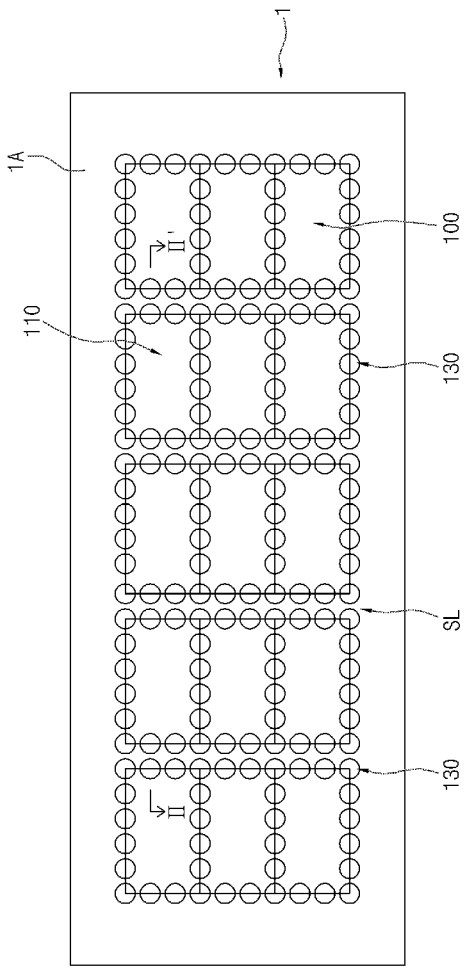
Figure 8:
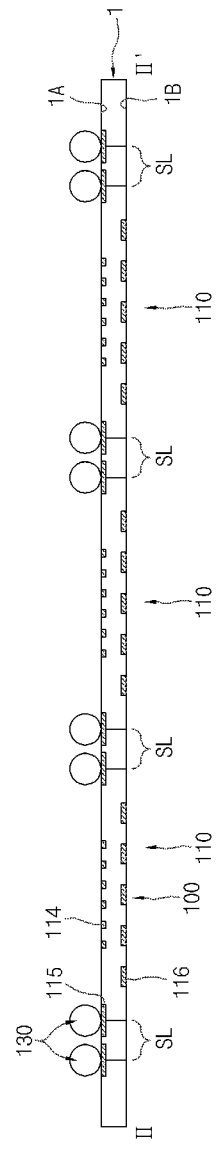

FIGS. 5 and 6 illustrate the case where the first ball lands 115 and the first solder balls 130 may be shared by the adjoining unit level substrates 110, which can however be applied only when the width of the sawing line SL is very small compared with the diameter of the first solder balls 130. In case where the width of the sawing line SL is relatively broad, as shown in reference to FIGS. 7 and 8. Referring to FIGS. 7 and 8, each of the first ball lands 115 may be formed over the edge of a single unit level substrate 110 and a portion of the sawing line SL adjacent thereto; and each of the first solder balls 130 may be formed over the respective first ball lands 115, such that the respective first ball lands 115 and the respective first solder balls 130 are used by a single unit level substrate 110. FIGS. 7-8 may also illustrate common features previously described with reference to FIGS. 5 and 6. Line II-II' is also illustrated in FIGS. 7 and 8.

Figure 9:
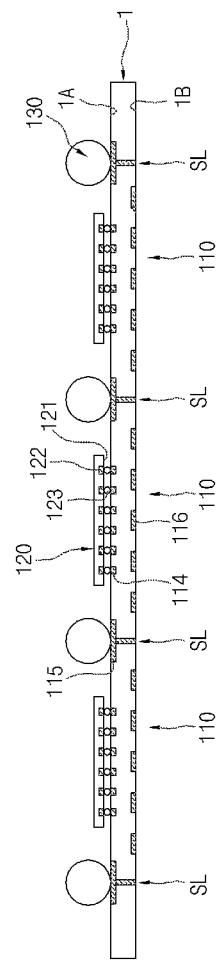

FIG. 9 may also illustrate features also illustrated in FIGS. 1-6. Referring to FIG. 9, the first semiconductor chip 120 may be mounted over the upper surface 1A of the respective unit level substrate 110. In an embodiment, the first semiconductor chip 120 may be provided with a plurality of the first bonding pads 122 formed over the first surface 121 thereof and the first bumps 123 formed over the respective first bonding pads 122. Furthermore, the first semiconductor chip 120 may be flip-chip bonded onto the upper surface 1A of the unit level substrate 110 such that the first bumps 123 may be bonded onto the first bonding fingers 114 formed over the upper surface 1A of the unit level substrate 110. The first semiconductor chip 120 may have a thickness smaller than the diameter of the first solder balls 130, preferably have a thickness smaller than half of the diameter of the first solder balls 130.

Figure 10:
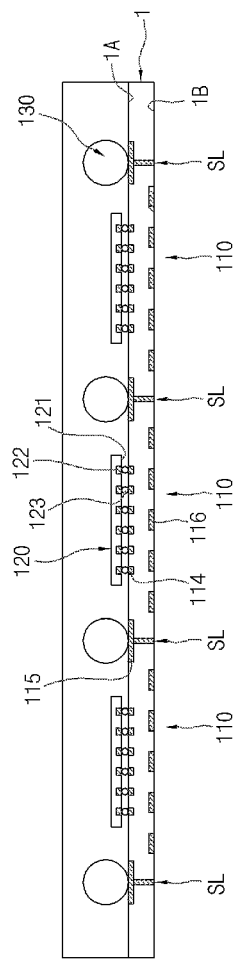

Referring to FIG. 10, a first mold part 140 may be formed, which molds the upper surface 1A of the strip level substrate 1 including the first semiconductor chips 120 and the first solder balls 130. The mold part 140 may include an EMC. FIG. 10 may also illustrate features illustrated in FIGS. 1-6 and FIG. 9.

Figure 11:
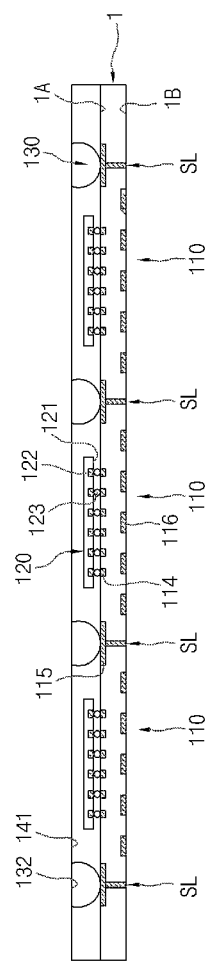

Referring to FIG. 11, the first mold part 140 and the first solder balls 130 may be polished. By the polishing process, the upper surface 132 of the first solder balls 130 may have a flat shape and may be exposed as the upper surface 141 of the first mold part 140. In order that the upper surfaces 132 of the first solder balls 130 are disposed on substantially the same plane as the upper surface 141 of the first mold part after the polishing process is completed, slurry having the same polishing ratio with respect to the first solder balls 130 and the first mold part 140 may be used upon the polishing process.

An area of the upper surface 132 of the respective first solder balls 130 exposed over the upper surface 141 of the first mold part 140 may be most large when the size of the first solder ball 130 is half of the size of the original spherical solder ball. Therefore, the polishing process is preferably performed until the size of the first solder balls 130 may become half of the size of the original spherical solder ball. This is for the purpose of ensuring the maximum contact area upon contact of the first solder ball 130 with the upper package through the upper surface 132 of the first solder ball 130. FIG. 11 may also illustrate features also illustrated in FIGS. 1-6 and FIGS. 9-10.

Figure 12:
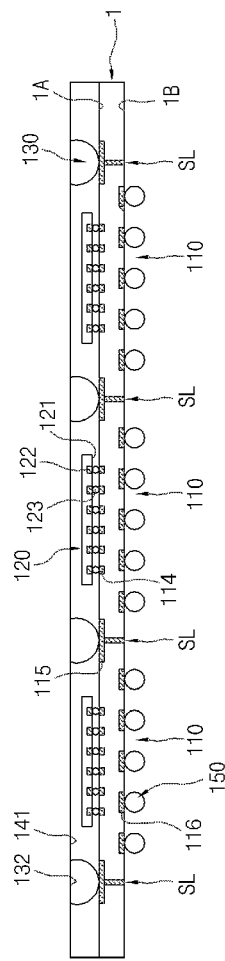

FIG. 12 may illustrate features illustrated in FIGS. 1-6 and FIGS. 9-11. Referring to FIG. 12, the third solder balls 150 may be formed over the respective second ball lands 116 on the lower surface 1B of the strip level substrate 1.

Figure 13:
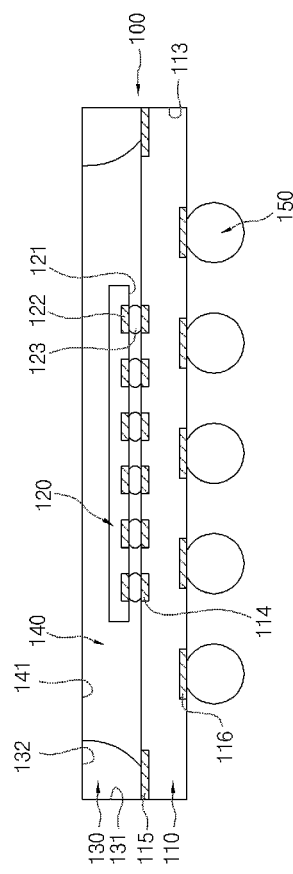

After that, the strip level substrate 1, the first mold part 140 and the first solder balls 130 may be cut along the sawing line SL using laser beam or blade to fabricate the lower semiconductor package 100 as shown in FIG. 13. More specifically, what may occur is manufacturing the lower semiconductor package 100 by cutting the strip level substrate 1, the first solder balls 130 and the first mold part 140 along the sawing line SL. Referring to FIG. 13, as the first solder balls 130 disposed over the edge of the unit level substrate 110 and the sawing line adjacent thereto are cut upon the cutting process, the first solder balls 130 may have a generally quarter-spherical shape.

After that, the upper package 200 may be stacked over the lower package 100 such that second solder balls 240 of the upper package 200 may be bonded onto the polished upper surface 132 of the first solder balls 130, respectively, thereby manufacturing the stacked package 10 as shown in FIG. 1. FIG. 13 may also illustrate features illustrated in FIGS. 1-6 and FIGS. 9-12.

The invention is not limited to the above embodiment described with reference to FIGS. 5 to 13 and may be modified to various forms.

For example, the stacked package 20 shown in FIG. 2 may be manufactured by mounting the first semiconductor chip 120 not in a flip-chip bonding type but in a wire bonding type upon the first semiconductor chip mounting process described with reference to FIG. 9. The stacked package 30 shown in FIG. 3 may be manufactured by bonding the second ball lands 214 of the upper package 200 not to the polished upper surface 132 of the first solder balls 130 but to the cutted side surface 131 of the first solder balls 130 when stacking the upper package 200 over the lower package 100.

Furthermore, the stacked package 40 shown in FIG. 4 may be manufactured by forming the additional first ball lands 115A over the upper surface 1A of the respective unit level substrates 110 in the process of forming the first ball lands 115 described with reference to FIGS. 5 and 6; forming the additional first solder balls 130A over the additional first ball lands 115A in the process of forming the first solder balls 130; and stacking the upper package 200 having the second solder balls 240 corresponding to the first solder balls 130 and the additional second solder balls 240A corresponding to the additional first solder balls 130A over the lower package 100 such that the second solder balls 240 and the additional second solder balls 240A may be bonded onto the first solder balls 130 and the additional first solder balls 130A, respectively.

With the various embodiments, the size of the lower package may be reduced since the first solder balls are cut and polished and thus the size of the first solder balls is reduced. Furthermore, the maximum size of a chip mountable in the lower package since the first solder balls may be disposed in the periphery of the lower package and the space in the lower package occupied by the first solder balls is small. Furthermore, bonding reliability between the upper and lower packages may be improved since the upper package may be bonded over the large areal upper surface (or side surface) formed by polishing (or cutting) the spherical solder ball having a large diameter. In addition, heat dissipating property may be improved since heat may be rapidly discharged through the solder balls of the lower package exposed to the outside.

Figure 14:
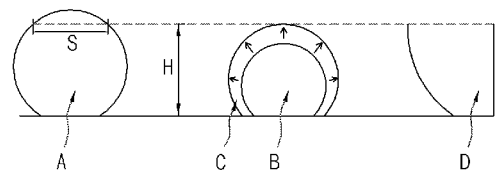
FIG. 14 is a view comparing a first solder ball in accordance with the invention with a conventional solder ball.

Referring to FIG. 14, under the condition where the height of the mold part of the lower package is fixed as H, a spherical solder ball A having a large diameter S may have a height larger than H and thus can have a sufficient bonding area to the upper package, thereby having superior bonding reliability. However, the solder ball A may occupy a large space in the lower package, which may lead to an increase in the size of the lower package. On the contrary, a spherical solder ball B having a small diameter may occupy a small space in the lower package and thus may be advantageous in terms of reduction in size of the lower package. However, the solder ball B having a small diameter may not be bonded to the upper package since the height of the solder ball B may be smaller than H. If the diameter of the solder ball is increased such that it is similar to the height H of the mold part (case C in FIG. 14), the solder ball may be bonded to the upper package but it may be difficult to ensure the bonding reliability due to the small area of the surface bonded to the upper package. The solder ball D in accordance with various embodiments may be formed by polishing the upper surface of a spherical solder ball having a large diameter and cutting the side surface thereof and a size of which may be approximately a quarter of the initial spherical solder ball. Therefore, the solder ball D in accordance with various embodiments may not only occupy small space in the package but also have a sufficiently large bonding area to the upper package, providing superior bonding reliability.

The stacked package in accordance with various embodiments may be applied to a variety of semiconductor devices and package modules.

Figure 15:
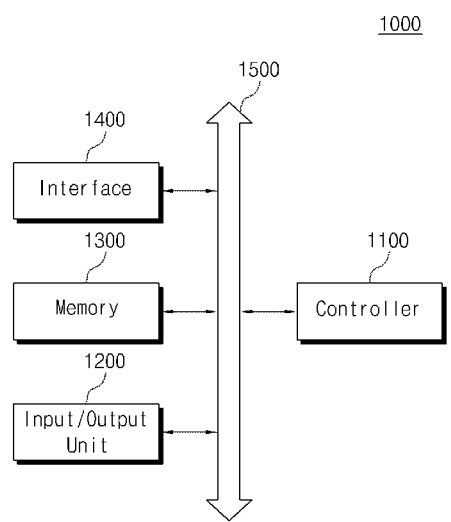
FIG. 15 is a block diagram illustrating a memory system having the stacked package in accordance with various embodiments of the invention.

Referring to FIG. 15, the stacked package in accordance with various embodiments may be applied to an electronic system 1000. The electronic system 1000 may include a controller 1100, an input/output unit 1200, and a memory 1300. The controller 1100, the input/output unit 1200 and the memory 1300 may be coupled with one another through a bus 1500. The bus 1500 may serve as a path through which data may move.

For example, the controller 1100 may include at least any one of the following: one or more microprocessors, one or more digital signal processors, one or more microcontrollers, and logic devices capable of performing the same functions as these components. The controller 1100 and the memory 1300 may include the stacked package according to various embodiments of the invention. The input/output unit 1200 may include at least one selected among a keypad, a keyboard, a display device, and so forth. The memory 1300 may be a device for storing data. The memory 1300 may store data and/or commands to be executed by the controller 1100 and the like.

The memory 1300 may include a volatile memory device and/or a nonvolatile memory device, such as a flash memory. For example, a flash memory to which the technology of the invention is applied may be mounted to an information processing system such as a mobile terminal or a desktop computer. The flash memory may be constituted by a solid state drive (SSD). In this case, the electronic system 1300 may stably store a large amount of data in a flash memory system.

The electronic system 1000 may further include an interface 1400 configured to transmit and receive data to and from a communication network. The interface 1400 may be a wired or wireless type. For example, the interface 1400 may include an antenna or a wired (or wireless) transceiver.

The electronic system 1000 may be realized as a mobile system, a personal computer, an industrial computer or a logic system performing various functions. For example, the mobile system may be any one of a personal digital assistant (PDA), a portable computer, a web tablet, a mobile phone, a smart phone, a wireless phone, a laptop computer, a memory card, a digital music system and an information transmission/reception system.

In the case where the electronic system 1000 is an equipment capable of performing wireless communication, the electronic system 1000 may be used in a communication system such as of CDMA (code division multiple access), GSM (global system for mobile communication), NADC (north American digital cellular), E-TDMA (enhanced-time division multiple access), WCDAM (wideband code division multiple access), CDMA2000, LTE (long term evolution) and Wibro (wireless broadband Internet).

Figure 16:
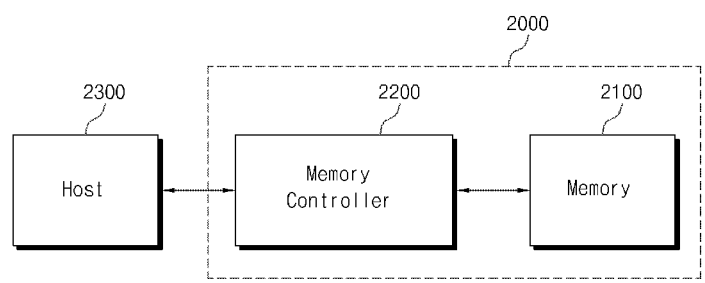
FIG. 16 is a block diagram showing an electronic system to which the stacked package in accordance with various embodiments of the invention is applied.

Referring to FIG. 16, the stacked package in accordance with various embodiments may be provided in the form of a memory card 2000. For example, the memory card 2000 may include a memory 2100 such as a nonvolatile memory device and a memory controller 2200. The memory 2100 and the memory controller 2200 may store data or read stored data.

The memory 2100 may include at least any one among nonvolatile memory devices to which the packaging technology of the embodiments of the invention is applied. The memory controller 2200 may control the memory 2100 such that stored data is read out or data is stored in response to a read/write request from a host 2300.

While the invention has been described with respect to the specific embodiments, it will be apparent to those skilled in the art that various changes and modifications may be made without departing from the spirit and scope of the invention as defined in the following claims.

What is claimed is:

1. A stacked package, comprising:
a lower package including a substrate formed with ball lands in a periphery of an upper surface thereof, a semiconductor chip mounted over the upper surface, first solder balls formed over the respective ball lands and each of said first solder balls having a side surface cut along an edge of the substrate and a polished upper surface, and a mold part for molding the upper surface, the semiconductor chip and the first solder balls, the cutted side surface and polished upper surface of the first solder balls being exposed by the mold part; and
an upper package stacked over the lower package and provided with second solder balls bonded to the first solder balls.

2. The stacked package of claim 1, wherein the cutted side surfaces of the first solder balls are disposed on the same plane as the side edge of the substrate.

3. The stacked package of claim 1, wherein the polished upper surfaces of the first solder balls are disposed on the same plane as an upper surface of the mold part.

4. The stacked package of claim 1, wherein the first solder balls have a quarter-spherical shape.

5. The stacked package of claim 1, wherein the second solder balls have a melting point lower than that of the first solder balls.

6. The stacked package of claim 1, wherein the second solder balls are in contact with the polished upper surfaces of the first solder balls, respectively.

7. The stacked package of claim 1, wherein the second solder balls are in contact with the cutted side surfaces of the first solder balls, respectively.

8. The stacked package of claim 1, wherein the substrate further includes additional first ball lands and the lower package includes additional first solder balls formed over the additional first ball lands.

9. The stacked package of claim 8, wherein an upper portion of the additional first solder balls are polished such that the additional first solder balls have a flat upper surface.

10. The stacked device of claim 9, wherein the flat upper surfaces of the additional first solder balls are disposed on a same plane as the polished upper surfaces of the first solder balls and an upper surface of the mold part.

11. The stacked device of claim 8, wherein the upper package further includes additional second solder balls bonded to the additional first solder balls, respectively.

12. The stacked package of claim 11, wherein the additional second solder balls have a melting point lower than those of the first solder balls and the additional first solder balls.

13. The stacked package of claim 1, wherein the semiconductor chip further includes:
bonding pads formed over a first surface of the semiconductor chip facing the substrate; and
bumps formed over the respective bonding pads and bonded to respective bonding fingers of the substrate.

14. The stacked package of claim 1, wherein the semiconductor chip further includes:
bonding pads formed over a second surface opposite to a first surface of the semiconductor chip that faces the substrate and electrically coupled with respective bonding fingers of the substrate.

15. The stacked package of claim 14, wherein the lower package further includes wires for electrically coupling the bonding pads of the semiconductor chip and the bonding fingers of the substrate.

* * * * *